United States Patent [19]
Carter

[11] Patent Number: 5,794,783
[45] Date of Patent: Aug. 18, 1998

[54] DIE-LEVEL BURN-IN AND TEST FLIPPING TRAY

[75] Inventor: Troy Carter, Chandler, Ariz.

[73] Assignee: Intel Corporation, Santa Clara, Calif.

[21] Appl. No.: 775,733

[22] Filed: Dec. 31, 1996

[51] Int. Cl.[6] ............................................. B65D 85/30
[52] U.S. Cl. .............................. 206/725; 206/562
[58] Field of Search ........................ 206/562, 701, 206/725, 726, 728; 361/810, 809, 807, 820

[56] References Cited

U.S. PATENT DOCUMENTS

| | | | |
|---|---|---|---|
| 5,400,904 | 3/1995 | Maston, III et al. | 206/725 |
| 5,418,692 | 5/1995 | Nemoto | 206/725 |
| 5,481,438 | 1/1996 | Nemoto | 206/725 |
| 5,551,572 | 9/1996 | Nemoto | 206/725 |
| 5,636,745 | 6/1997 | Crisp et al. | 206/725 |

*Primary Examiner*—David T. Fidei
*Attorney, Agent, or Firm*—Blakely, Sokoloff, Taylor & Zafman

[57] ABSTRACT

A die-level test and burn-in flipping tray. A tray having a plurality of pockets adapted to receive die-level carriers formed thereon is provided. The pockets are defined by four risers, one riser defining each corner of the pocket and a support at the base of each riser to support a die-level carrier disposed within the pocket. The riser and the tray are molded such that a second tray may be mated with the original tray, the second tray having pockets in one-to-one correspondence with the first tray. The mated tray pair may then be inverted causing carriers in pockets of the first tray to transition under the influence of gravity to corresponding pockets of the second tray in an orientation inverted about the z-axis.

6 Claims, 4 Drawing Sheets

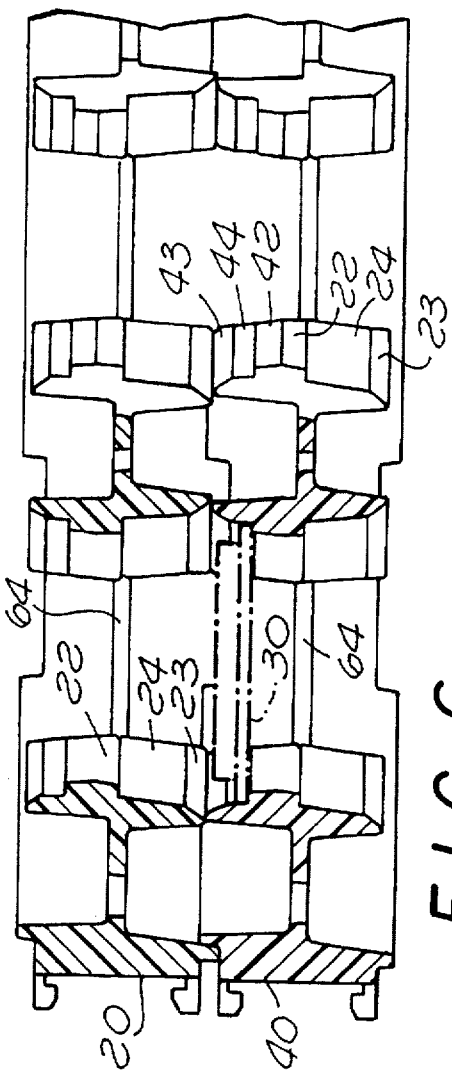
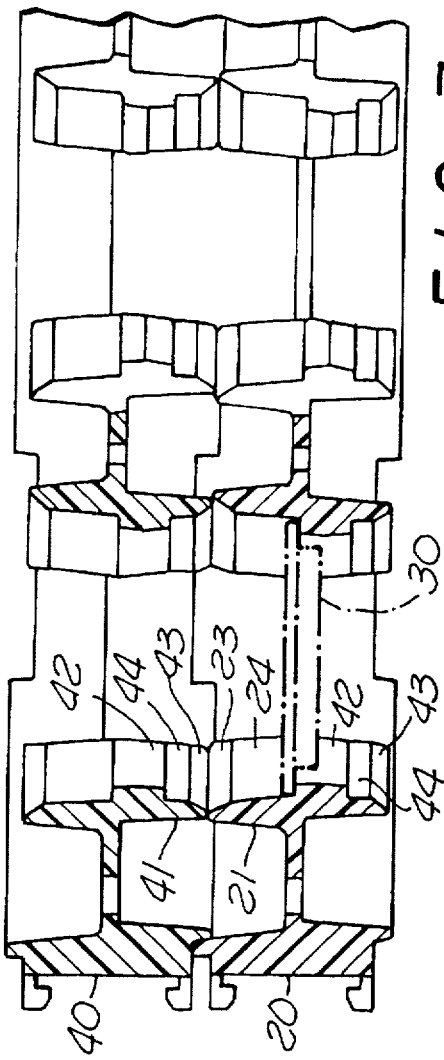
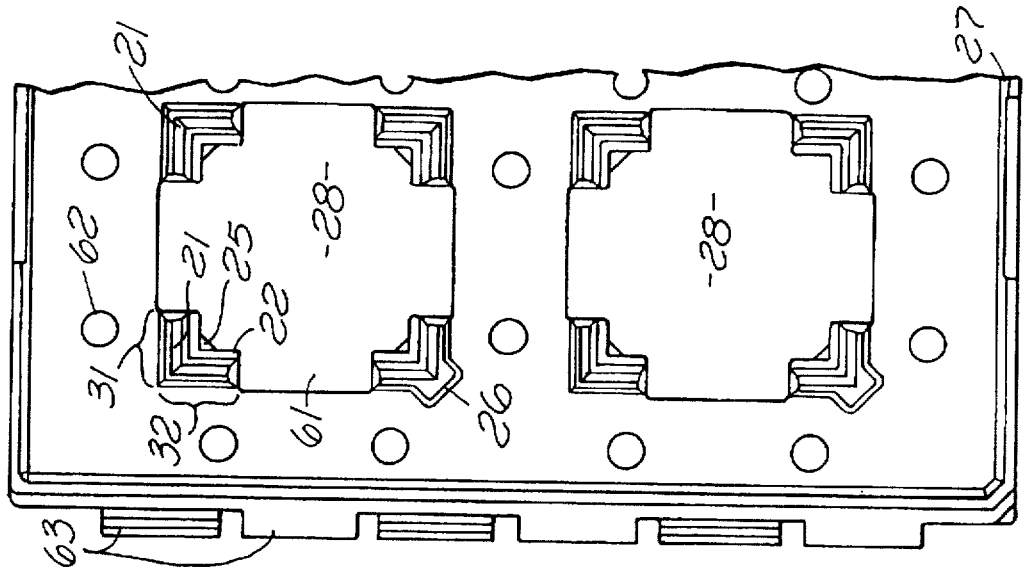

DIE-LEVEL BURN-IN AND TEST FLIPPING TRAY

BACKGROUND OF THE INVENTION

(1) Field of the Invention

The invention relates to a tray for holding die-level components during the test and burn-in processes. More specifically, the invention relates to a tray which permits the orientation of die-level component carriers to be easily inverted as required by test and burn-in processes.

(2) Related Art

For years, fabricated integrated circuits have been packaged using well-known technology. The packaged components are then subjected to test and burn-in processes as part of the quality control to help insure that the components meet established specifications and do not fail easily when stressed. The packaged components are retained in trays. The Joint Electronic Device Engineering Council (JEDEC) defined dimensions of the industry standard for these trays which are known as JEDEC trays. The packaged components are removed from the trays to be inserted into a particular test or burn-in device by automated equipment, and then returned to the trays when that particular process is completed. Test and burn-in are conducted as several individual processes, each involving a particular piece of testing equipment. An operator carries trays (or stacks of trays) of components between the different pieces of equipment. The operator effectively moves the trays from one automated process to the next. Eventually when all the individual test and burn-in processes are complete, the packaged components are actually shipped to customers within those trays.

More recently with downsizing of electronic devices, demand for die-level components has increased. This is because, by eliminating the packaging, the same processing power can be achieved using only a fraction of the space. However, it is still necessary to run test and burn-in procedures with the same rigor on the dielevel components as previously performed on the packaged components. To this end, carriers were developed to retain the die-level components during test and burn-in. FIG. 1a shows a top perspective view of a prior art 280 pin carrier. The carrier is comprised of a substrate 1 having a plurality of contacts 3 around an upper surface 6 of substrate 1. Substrate 1 has an internal cavity not shown to retain the die-level component. A lid 2 overlays the substrate 1 and retains the die-level component within the substrate cavity. A lid latch 4 locks the lid 2 into place. Backplate 5 sandwiches the substrate 1 between itself and the lid 2 and provides an anchor point for the lid latch 4. Die-level components are loaded into carriers and placed in JEDEC trays by automated equipment. A tray of loaded carriers is then ready to undergo test and burn-in. Unlike packaged components, the die-level components are not shipped in the trays used during test and burn-in. After test and burn-in, the die-level components are removed from the carriers by automated equipment and inserted into gel packs. The gel packs, rather than the trays, are then shipped to the end customer. This allows the carrier to be reused. The carriers are also expensive. Thus, to make it profitable to sell die-level components at all, it is important to get the cycle rate up and such that reuse of the carriers justifies their cost.

FIG. 1b shows a bottom perspective view of a carrier of FIG. 1a. Significantly, the bottom surface 7 of substrate 1 has no contact points. Thus, while these carriers were developed to be retained in the standard JEDEC trays used for the package component, some of the test and burn-in equipment requires that the carriers be handled in lid up orientation, while other of the test and burn-in equipment requires that the carriers be handled in lid down orientation. This is true because the contact points 3 exist only on top surface 6 of substrate 1. Conversely, with prior art packaged components, the leads off the package can be contacted from either the top or the bottom so no change in orientation is required as they move through the test and burn-in processes.

The required orientation changes for test and burn-in of die-level components necessitate either large capital expenditures to develop a piece of equipment to invert the orientation each time inversion is required as the components move through the test and burn-in processes, or requires an operator to spend significant time flipping each component individually before inserting the JEDEC trays of components into the next test or burn-in device. In a typical series of test and burn-in processes, it will be necessary to flip the carriers four to eight times. The carriers are relatively fragile and if dropped, are ruined. Increased handling necessarily increases the risk of components being dropped and also slows cycle time through the overall process. Assuming a new piece of capital equipment, this requires that the trays be taken to that equipment four to eight additional times, thereby significantly slowing the process over what would be required for package components. This would also require a significant capital expenditure. Thus, either option significantly increases cost and slows turnaround time of die-level components moving through the line.

In view of the foregoing, it would be desirable to have a fast, low cost way to change the orientation of carriers for die-level components, during the test and burn-in processes, without undue delay or excessive risk of dropping components.

BRIEF SUMMARY OF THE INVENTION

A die-level test and burn-in flipping tray is disclosed. A tray having a plurality of pockets adapted to receive die-level carriers formed thereon is provided. The pockets are defined by four risers, one riser defining each corner of the pocket and a support at the base of each riser to support a die-level carrier disposed within the pocket. The riser and the tray are molded such that a second tray may be mated with the original tray, the second tray having pockets in one-to-one correspondence with the first tray. The mated tray pair may then be inverted causing carriers in pockets of the first tray to transition under the influence of gravity to corresponding pockets of the second tray in an orientation inverted about the z-axis.

BRIEF DESCRIPTION OF THE DRAWINGS

FIG. 5 is a partial plan view of a lid up side of the flipping tray of FIG. 3.

FIGS. 6 and 7 are partial cross-sectional views of a pair of mated flipping trays with a carrier shown in phantom detail.

DETAILED DESCRIPTION OF THE INVENTION

Figure 1A:
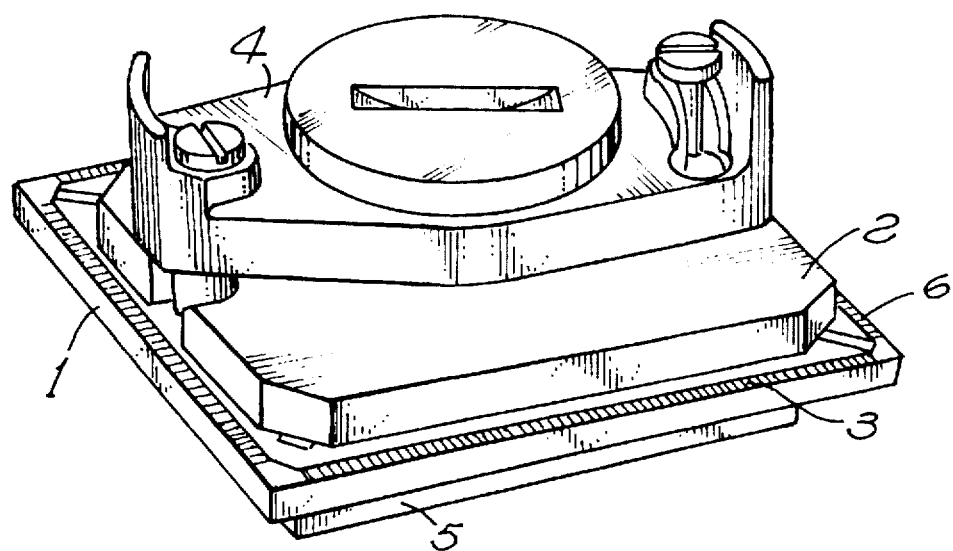
FIG. 1a an elevated perspective view of a prior art die-level component carrier.
Figure 1B:
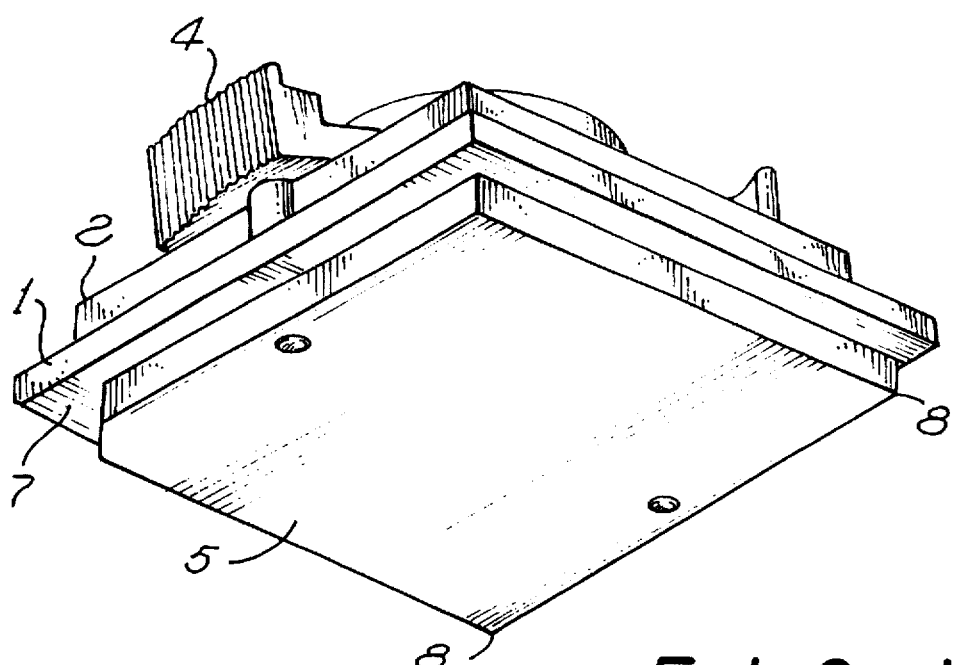
FIG. 1b is a bottom perspective view of a prior art die-level component carrier.
Figure 2:
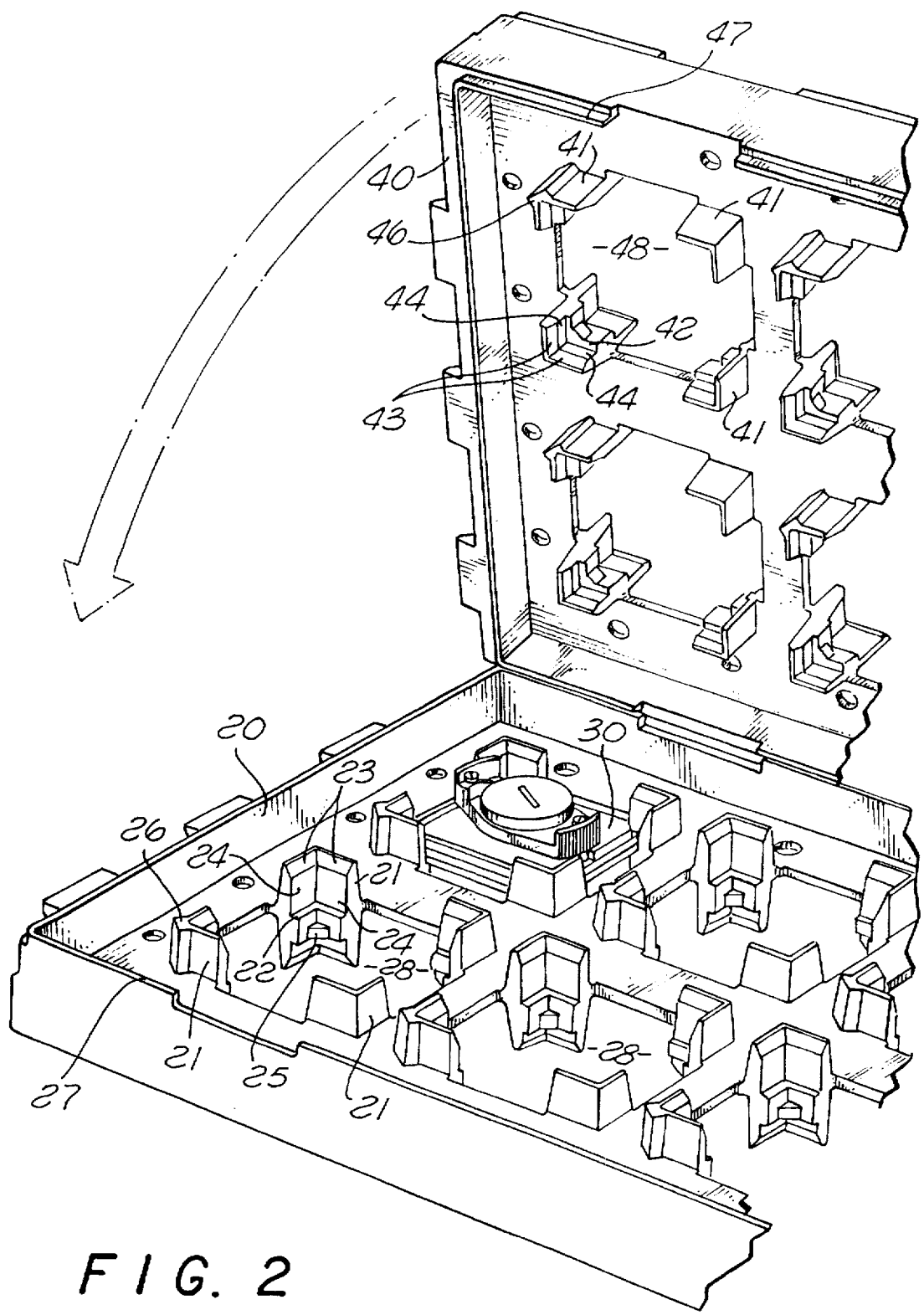
FIG. 2 is a partial perspective view of a pair of die-level flipping trays of one embodiment of the invention.

FIG. 2 shows a partial prospective view of a pair of flipping trays for one embodiment of the invention. These trays are the same external dimension as standard JEDEC trays and are adapted to hold 280 pin carriers. Tray 20 can be seen in an elevated perspective view, while tray 40 has been rotated to reveal its lid down pockets 48. In one embodiment of the invention, both tray 40 and tray 20 are identical. Risers 21 define the corners of a pocket 28 for retaining a die-level carrier in a lid up orientation. Die-level carrier 30 is shown in the lid up orientation in one of the pockets 28 of tray 20. The risers 21 are all symmetric about the center of the pocket 28. The base of each riser 21 has a support member 22 integrally formed therewith. In one embodiment, the support members 22 are L-shaped. This allows them to accommodate the hard corners 8 of backplate 5 (referring to FIGS. 1a and 1b) such that the lower surface of 7 of the substrate 1 rests on the supports 22 in each corner of the pocket 28. The dimension of the bottom of the pocket 28 should be of a size to accommodate a carrier without interference by the surfaces 24 of the risers 21 when the carrier is resting in the pocket 28.

Cross member 25 is integrally formed below the level of the support 22 and helps to insure that the carriers will not fall out of the pockets during flipping. Each riser has upper inner surfaces 23 which slope downward at approximate 30° to lower inner surfaces 24 which slope downward more steeply at approximately 3° off the vertical. Sloped surfaces assist in the transition of the carriers during flipping, but other angles are envisioned within the scope and contemplation of the invention. Orientation indicator 26 is integrally formed with the external surface of one riser 21 of each pocket 28. This orientation indicator is used to insure that all carriers are placed within a tray in the same orientation, e.g., placing pin one towards the orientation indicator for each carrier in the tray. The carrier substrate typically bears an indication of the location of pin one. By placing pin one toward the orientation indicator, proper orientation within the test and burn-in equipment can be assured.

Risers 41 define a corresponding pocket on tray 40. Again, the risers 41 have upper interior surfaces 43 sloping at 30° to join inner surfaces 44 which slope downward at 3° off the vertical (again other angles could be used). Support members 42 are A-shaped rather than L-shaped as a result of cross member 25 being flush with the load bearing surface of support 42. This is acceptable because pocket 48 is intended to retain the carrier 30 in a lid down orientation. Thus, it is not necessary to accommodate the hard corners of the backplate 5 as would be required by a lid up orientation. Moreover, as mentioned above, this cross member 25 reduces the probability that a carrier will escape from the tray 40 during flipping. One riser 41 of pocket 48 also has an orientation indicator 46 integrally formed therewith. As can be seen in the figure, that if the trays are mated together, the orientation indicators 26, 46 of each pocket and corresponding pocket, respectively, are consistent.

Tray 20 has an upper rim 27 which is adapted to mate with lower rim 47 of tray 40. When mated, the pockets of tray 20 will be directly aligned with corresponding pockets of tray 40. The mating of trays prevents relative movement in an x-y plane, however, the top tray may be easily lifted off in a z-direction. Thus, inversion of the mated combination of trays 20 and 40 would result in carrier 30 transitioning under the influence of gravity into a corresponding pocket of tray 40 in a lid down orientation. Tray 20 can then be removed, and the orientation of carrier 30 has effectively been changed along the z-axis.

Figure 3:
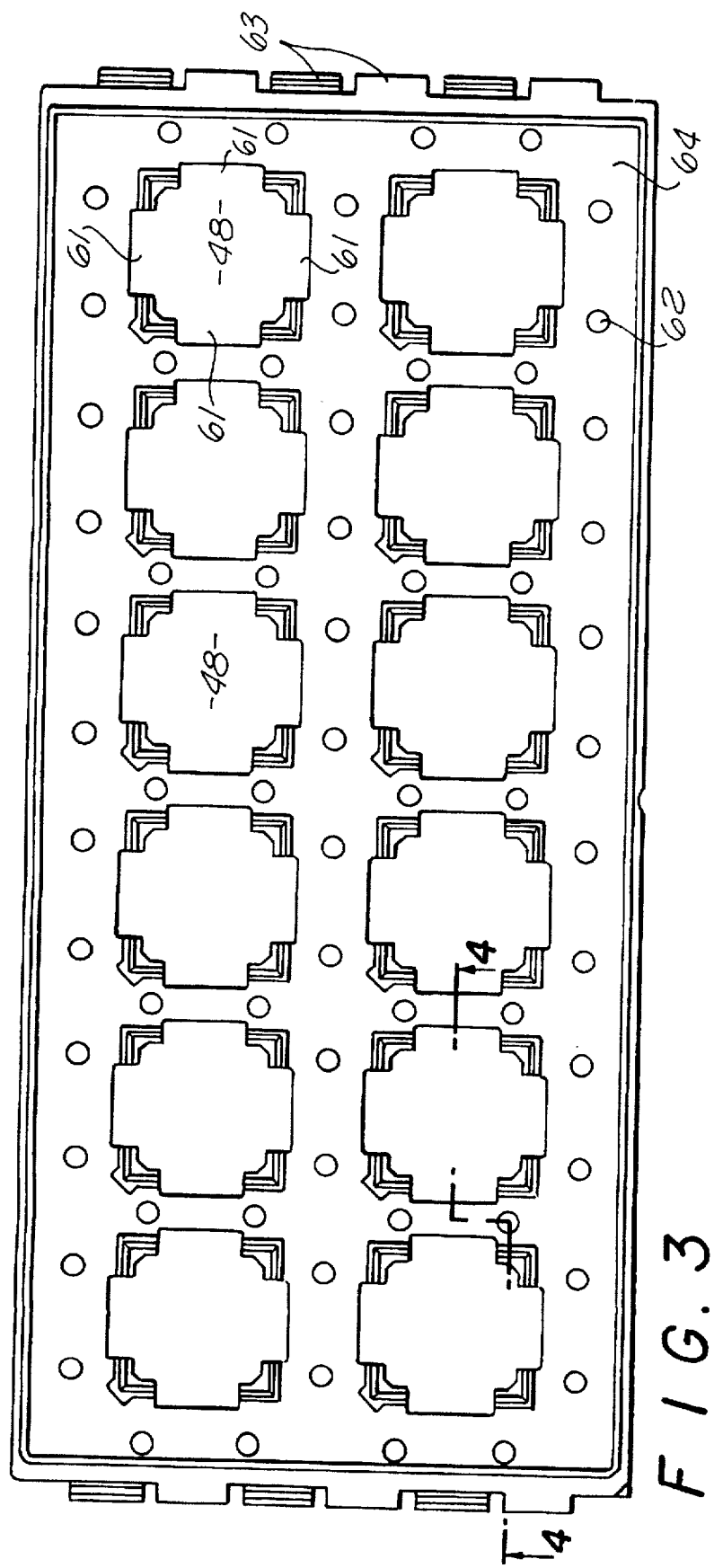
FIG. 3 is a plan view of a lid down side of a flipping tray of one embodiment of the invention.

FIG. 3 shows a plan view of a lid down side of a tray of one embodiment of the invention. Twelve pockets 48, each sized to hold a 280 pin carrier, are distributed in two rows of six pockets each. The center-to-center dimension between two adjacent pockets within a row is 1.9 inches. Thus, the distance between center of the first pocket in the row and the center of the first pocket in the second half of the row is 5.7 inches. This dimension has been found desirable for automated handling of the carriers. Additional spaces 61 are provided between pairs of risers along each side of the pocket to further facilitate automated handling. The floor 64 of the tray 40 defines a plurality of irrigation holes 62. The irrigation holes 62 are distributed around the tray consistent with prior practice. Attachment hooks 63 are provided on either end of the tray to allow stacks of trays to be held by the test and burn-in equipment. These hooks 63 do not depart significantly from such hooks on prior art JEDEC trays.

Figure 4:
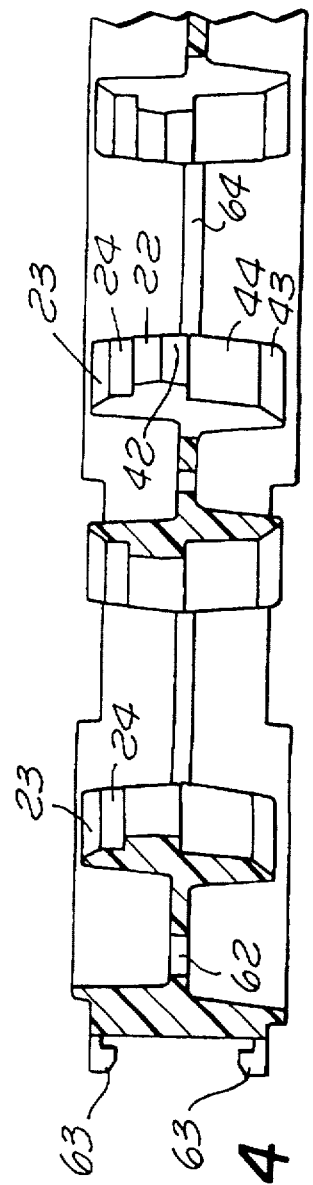
FIG. 4 is a partial cross-sectional view of the flipping tray of FIG. 3.

FIG. 4 shows a partial cross-sectional view of a tray of one embodiment of the invention. In FIG. 4, it can be seen that the supports 22 of a lid up pocket are recessed slightly below the level of the tray floor 64. This results in a carrier retained in a lid up orientation having its substrate close to level with the tray floor 64. Conversely, the supports 42 in a lid down pocket are elevated above the floor 64. Thus, in the lid down orientation, the substrate of the carrier is maintained above the floor 64. This allows the carrier to be easily retrieved from the pocket regardless of it orientation. While recessing the supports 42 of the lid down pockets is within the scope and contemplation of the invention, having the lid down substrate flush with the floor 64 makes handling more difficult. Similarly, the supports 22 could be elevated, however, care should be taken such that a carrier lid up resting on supports 22 does not interfere with stacking of trays because the lid later extends above the risers.

FIG. 5 shows a partial plan view a lid up side of a tray of one embodiment of the invention. FIG. 5 shows two lid up pockets 28 defined by users 21. L-shaped supports 22 are integrally formed at the base of each riser 21. Cross piece 25 is recessed below support 22 and integrally formed therewith. Leg 31 and leg 32 of riser 21 are equal length. The length of legs 31 and 32 should be selected so that a corner of the carrier substrate does not easily escape from the riser during flipping.

FIG. 6 and FIG. 7 show a partial cross-sectional view of a pair of mated trays in one embodiment of the invention. A carrier 30 is shown in phantom detail. As shown in FIGS. 6 and 7, a lid up pocket is formed concentric with a lid down pocket of the same tray. Moreover, stacking of additional trays will result in corresponding pockets being overlaid above and concentric with the underlying tray. When mated, corresponding risers 21 and 41 are disposed in close proximity to one another. It is not necessary that riser 21 and 41 actually make physical contact. However, the space between them should be sufficiently small that the carrier cannot escape a pocket pair defined by eight corresponding risers. FIG. 6 shows phantom carrier 30 in a lid down orientation. FIG. 7 shows phantom carrier 30 in a lid up orientation. Moving from FIG. 6 to FIG. 7 is merely a matter of rotating or rolling the mated trays such that the top tray becomes the bottom tray and vice versa. Stated differently, when the trays are mated as shown, a change of orientation about the z-axis is effected simply by inverting the mated trays. The gravity will cause the carrier to transition to the lower pocket resulting in inversion of the carrier about the z-axis.

Typically, during inversion of a pair of mated trays, one edge of the carrier will drop into the new pocket first. Thus, to prevent the carriers from falling from the trays, it is desirable that a diagonal cross dimension between, for example, an adjacent pair of supports 22 and an opposing pair of supports 42 (i.e., the pair of supports furthest from the adjacent pair of supports 22 in the pocket pair defined by eight risers 21, 41) be less than the cross-dimension of the carrier substrate. Thus, with an edge of the substrate abutting a pair of risers 21 during flipping, a leading edge of the substrate will still land on the diagonally most distant supports 42, and the carrier will transition into pocket 48. Thus, in the context of normal flipping, the carriers cannot escape the pocket pairs created by mating a pair of trays.

It should be noted that, in the preferred embodiment, it is not necessary to flip tray pairs individually. Rather, a stack of trays may be flipped simultaneously merely by adding one empty tray to the top of the stack and inverting the entire stack at once. Then, lifting off what was formerly the bottom tray, will yield a whole stack of inverted carriers. A typical operator can simultaneously flip three to five trays with ease. As previously mentioned, operators currently carry the trays of components from one piece of automated test or burn-in equipment to the next, placing them within the automated equipment at each point for continued processing. Thus, the flipping ease of the invention is wholly embedded and does not significantly increase delay over what would be required without flipping. Capital intensive introduction of a new piece of equipment into the operation is avoided. Further, while there is always a risk that an operator may be careless and drop a tray, since it is merely a matter of inverting mated trays, it is less likely on average that the components would be damaged by operator handling than if the operator were required to manually flip individual carriers.

The preferred embodiment has a lid up pocket backed up against a lid down pocket, all integrally formed as part of one tray. It is also within the scope and contemplation of the invention to have two different trays, one having solely cap up pockets, and the other having solely cap down pockets. It is envisioned that the trays of the instant invention may be molded out of durable thermoplastic or other similar material. It is also envisioned that trays for other sizes of carriers while requiring different pocket dimensions are still within the scope and contemplation of this invention. The pockets for other sizes of carriers should follow similar rules, to those described above, e.g., the interferences between the carrier and the tray should be minimized while simultaneously minimizing the chance of the carrier escaping from a pocket pair. Moreover, a change in carrier design such that carriers did not have a hard-cornered backplate would permit all pockets to have A-shaped supports, and such is also within the scope and contemplation of the invention. Additionally, while the supports have been described as A-shaped and L-shaped, other shapes of supports could be used without departing from the scope and contemplation of the invention.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An apparatus comprising:

a first set of pockets integrally disposed on a first side of the tray;

a second set of pockets integrally disposed on a second side of the tray such that a one-to-one correspondence exists between the first set of pockets and the second set of pockets;

an upper rim; and a lower rim, the upper rim and lower rim adapted to mate with lower and upper rims, respectively, of additional trays such that respective first and second sets of pockets are disposed in relation to one another to cause a plurality of carriers in the first set of pockets to transition to the second set of pockets in an inverted orientation responsive to inversion of a mated pair of trays;

wherein each pocket is defined by four risers and four supports, one support integrally formed on an inside base of each riser defining one corner of the pocket and wherein the supports integrally formed on the bases of the risers of the first set of pockets are L-shaped and wherein the supports integrally formed on the base of the risers of the second set of pockets are A-shaped.

2. A tray for holding die-level carriers during test and burn-in comprising:

a first set of pockets integrally disposed on a first side of the tray;

a second set of pockets integrally disposed on a second side of the tray such that a one-to-one correspondence exists between the first set of pockets and the second set of pockets;

an upper rim; and a lower rim, the upper rim and lower rim adapted to mate with lower and upper rims, respectively, of additional trays such that respective first and second sets of pockets are disposed in relation to one another to cause a plurality of carriers in the first set of pockets to transition to the second set of pockets in an inverted orientation responsive to inversion of a mated pair of trays;

wherein each pocket of the first set of pockets and each pocket of the second set of pockets is defined by four risers and four supports, one support integrally formed on an inside based of each riser, each riser defining one corner of the pocket.

3. The tray of claim 1 wherein each pocket is sized to hold a 280 pin carrier.

4. The tray of claim 1 wherein the plurality of pockets are configured in rows and a distance between a first pocket center and a second pocket center is approximately 5.7 inches and wherein the second pocket center is a first pocket in a second half of a row.

5. The tray of claim 1 wherein the first set of pockets retains carriers in a lid up orientation and the second set of pockets retains carriers in a lid down orientation.

6. An apparatus comprising:

a first set of pockets integrally disposed on a first side of the tray;

a second set of pockets integrally disposed on a second side of the tray such that a one-to-one correspondence exists between the first set of pockets and the second set of pockets;

an upper rim; and a lower rim, the upper rim and lower rim adapted to mate with lower and upper rims, respectively, of additional trays such that respective first and second sets of pockets are disposed in relation to one another to cause a plurality of carriers in the first set of pockets to transition to the second set of pockets in an inverted orientation responsive to inversion of a mated pair of trays;

wherein each pocket is defined by four risers and four supports, one support integrally formed on an inside base of each riser defining one corner of the pocket and wherein one of the four risers has an orientation indicator formed thereon.

* * * * *